(12) United States Patent
Kaiser et al.

(10) Patent No.: US 12,115,736 B2
(45) Date of Patent: Oct. 15, 2024

(54) BONDING TOOL, BONDING DEVICE AND BONDING METHOD

(71) Applicant: ASM AMICRA Microtechnologies GmbH, Regensburg (DE)

(72) Inventors: Rudolf Kaiser, Lappersdorf (DE); Horst Lapsien, Regensburg (DE)

(73) Assignee: ASMPT AMICRA MICROTECHNOLOGIES GMBH, Regensberg (DE)

( * ) Notice: Subject to any disclaimer, the term of this patent is extended or adjusted under 35 U.S.C. 154(b) by 434 days.

(21) Appl. No.: 17/597,912

(22) PCT Filed: Jul. 29, 2020

(86) PCT No.: PCT/EP2020/071362
§ 371 (c)(1),
(2) Date: Jan. 28, 2022

(87) PCT Pub. No.: WO2021/023591
PCT Pub. Date: Feb. 11, 2021

(65) Prior Publication Data
US 2022/0274347 A1 Sep. 1, 2022

(30) Foreign Application Priority Data
Aug. 2, 2019 (DE) ...................... 10 2019 120 955.2

(51) Int. Cl.
*B29C 65/48* (2006.01)
*B29C 65/52* (2006.01)
*B29C 65/78* (2006.01)

(52) U.S. Cl.
CPC ........ *B29C 65/4845* (2013.01); *B29C 65/524* (2013.01); *B29C 65/782* (2013.01); *B29C 65/7847* (2013.01)

(58) Field of Classification Search
None
See application file for complete search history.

(56) References Cited

U.S. PATENT DOCUMENTS

| 5,316,610 A | 5/1994 | Tamaki et al. |
| 9,620,476 B2 | 4/2017 | Lee et al. |

(Continued)

FOREIGN PATENT DOCUMENTS

| DE | 102017125932 A1 | 5/2019 |
| JP | 2001102395 A * | 4/2001 |

OTHER PUBLICATIONS

Machine English translation of DE102017125932, Accessed Jul. 19, 2024 (Year: 2017).*

(Continued)

*Primary Examiner* — Jacob T Minskey
*Assistant Examiner* — Adrianna N Konves
(74) *Attorney, Agent, or Firm* — WELSH FLAXMAN & GITLER LLC

(57) ABSTRACT

The invention relates to a bonding tool for a bonding device for bonding at least one component by adhesives to a substrate, the bonding device including a circular disc-shaped main body lying in a main plane and having an opening and a receiving head connected to the main body for receiving and holding the components, an orthogonal projection of the receiving head onto the main plane lying within the opening so that the receiving head is freely accessible through the opening. The bonding tool has a lighting unit integrated in the bonding tool for curing the adhesive. The invention also relates to a bonding device for bonding at least one component by adhesives applied to a substrate located in an assembly position, and to a bonding method for bonding components by adhesives applied to a substrate.

23 Claims, 4 Drawing Sheets

(56) References Cited

U.S. PATENT DOCUMENTS

| | | |
|---|---|---|
| 2003/0071106 A1 | 4/2003 | Bendat et al. |
| 2008/0202677 A1 | 8/2008 | Ok |
| 2019/0057891 A1 | 2/2019 | Marinov et al. |
| 2019/0225837 A1 | 7/2019 | Ernst |

OTHER PUBLICATIONS

Machine English translation of JP-2001102395-A, Accessed Jul. 19, 2024 (Year: 2001).*

* cited by examiner

BONDING TOOL, BONDING DEVICE AND BONDING METHOD

BACKGROUND OF THE INVENTION

1. Technical Field

The invention relates to a bonding tool for a bonding device for bonding at least one component by adhesives to a substrate, to a bonding device for bonding at least one component by adhesives to a substrate located in an assembly position, and to a bonding method for bonding components by adhesives to a substrate.

2. Description of the Related Art

Bonding devices for bonding at least one component by means of adhesives to a substrate, bonding tools for such bonding devices, and bonding methods for bonding components by means of adhesives to a substrate, are well known from the prior art. A bonding method, which provides for a particularly high accuracy during the positioning of the components, as well as a corresponding bonding device, are described, for example, in PCT Publication No. WO 2004/112100 A1, in which the bonding device includes a detection station, by means of which at least two sides of a component are detected with respect to their position and/or dimensions. For this purpose, the detection station preferably contains at least two camera systems for detecting a respective side of the component. When the components are positioned exactly, they are preferably connected to one another by means of laser soldering.

As an alternative to the laser soldering, the component can also be bonded to the substrate by means of adhesives. The high thermal stress to the substrate and/or component, which occurs during the laser soldering, can be reduced or avoided thereby. To accelerate the curing of the adhesive, light is preferably applied thereto. It is a disadvantage of the known bonding devices that the positioning of the light source is difficult as the light path from the light source to the adhesive must not be blocked by a bonding head, comprising a bonding tool, which holds the component. The positioning of the light source is then further complicated when the exact alignment of the component to the substrate is to be monitored by a camera system, and the camera system and the light source must not be in each other's way.

SUMMARY OF THE INVENTION

It is thus the object of the present invention to provide a bonding tool for a bonding device for bonding at least one component by adhesives to a substrate, which simplifies the application of the adhesive with light for curing the adhesive. It is furthermore the object of the present invention to provide a bonding device comprising a bonding tool of this type, as well as a bonding method for bonding components by adhesives to a substrate.

What is proposed is a bonding tool for a bonding device for bonding at least one component by adhesives to a substrate. The bonding tool thereby comprises a circular disk-shaped base body lying in a base plane and comprising an opening. The axis of rotation of the circular disk-shaped base body is thus perpendicular to the base plane. A receiving head for receiving and holding the components is connected to the base body. The receiving head is thereby arranged on the base body in such a way that an orthogonal projection of the receiving head onto the base plane lies within the opening, so that the receiving head can be accessed freely through the opening. This means that, when looking at the bonding tool in the direction of the axis of rotation, the receiving head lies within the opening. It is possible thereby, however, that the receiving head lies underneath or above the base plane. Due to the fact that the receiving head can be accessed freely through the opening, for example the receiving head and the component held by the receiving head can be measured through the opening by a camera system, so that an exact positioning of the component to the substrate is made possible.

According to the invention, the bonding tool has a lighting unit, which is integrated in the bonding tool, for curing the adhesive. The adhesive cures quickly by an application with light of suitable wavelengths. Due to the fact that the lighting unit is integrated in the bonding tool, an illumination of the adhesive is possible even at difficult assembly positions. The bonding tool and a bonding head, on which the bonding tool is arranged, can no longer obstruct the light path from the lighting unit to the adhesive. For a camera system it is furthermore also possible to measure the receiving head and the component to be bonded through the opening of the bonding tool. Due to the fact that the lighting unit is integrated in the bonding tool, a replacement of the bonding tool at the bonding head is furthermore possible, without a need for complex adjustment of the lighting unit to the bonding tool after the insertion of the new bonding tool.

The lighting unit is advantageously replaceable. For example, lighting units, which provide light of a different wavelength, or lighting units comprising another arrangement of the light sources, can thus be used. Also, in the case of defective light sources, the lighting unit can be replaced easily with a lighting unit comprising functional light sources. Furthermore, it is preferably possible to operate the bonding tool completely without lighting unit when this is necessary for a certain utilization.

It is advantageous when the lighting unit is a UV lighting unit. UV light is thereby understood to be light with wavelengths in the range of from 100 nm to 405 nm. The curing of many adhesives is promoted or first made possible by UV light, so that the use of UV light is ideal for the curing of many adhesives. The lighting unit thereby preferably comprises light sources, the spectrum of which is adapted to the respective adhesive.

It is particularly advantageous when the UV lighting unit is a UV LED unit. The latter is characterized by a small overall size, low energy consumption, a low heat development, as well as a long service life.

It is advantageous when the UV LED unit comprises at least two, preferably four, LEDs. A good illumination of the adhesive can be achieved by two LEDs, which are preferably assembled on opposite sides of the receiving head. However, an even better illumination of the adhesive is obtained by four LEDs, which are arranged so as to be distributed evenly around the receiving head. Shadow casts are largely avoided thereby, so that the adhesive can cure approximately evenly at all positions.

The lighting unit advantageously comprises a cooling unit. Even by LEDs, which have only a low heat development, the lighting unit heats up, in particular during longer use. Due to an increased temperature, however, the accuracy during the bonding of the component onto the substrate suffers. Moreover, an increased temperature can affect a material fatigue and/or material aging of the bonding tool as well as of the substrate and of the component. If the resulting heat is discharged by the cooling unit, these disadvantages are eliminated. In particular cooling fins are thereby suitable as cooling unit, because they do not require a separate energy supply and ensure a good heat output across their large surface.

It is advantageous when the lighting unit is electrically connected to the base body via an electrical interface. The lighting unit is then supplied with electrical energy via this electrical interface, so that a separate energy supply of the lighting unit is not necessary.

It is advantageous when the receiving head comprises a gripping unit and/or a vacuum unit. The components are preferably gripped on their edge by the gripping unit, while the vacuum unit seizes a component to be bonded on a top or side surface of the component by negative pressure. The selection of a gripping unit or vacuum unit is thereby primarily determined by the component to be bonded.

The bonding tool advantageously comprises fastening elements for fastening to a bonding head of the bonding device. The bonding tool is thus arranged in a replaceable manner on the bonding head, so that an optimal bonding tool can be received at the bonding head, for example depending on the component to be bonded.

It is advantageous when the fastening elements comprise an, in particular V-shaped, groove, which is arranged on the circumference of the base body. Corresponding holding elements of the bonding head then engage with this groove and thus fasten the bonding tool to the bonding head. Due to the fact that the groove is arranged on the circumference of the circular disk-shaped base body, the bonding tool can be rotated about the axis of the rotation of the circular disk-shaped base body with respect to the bonding head, for example in order to provide for an exact alignment of the component with respect to the substrate.

It is advantageous when the bonding tool has at least one magnet and/or a ferromagnetic region for magnetically fastening the bonding tool to a bonding head of the bonding device. The bonding head then accordingly has a ferromagnetic region and/or a magnet, so that the bonding tool is held on the bonding head by magnetic force. This fastening allows for a particularly quick replacement of bonding tools on the bonding head.

The bonding tool advantageously has an adjusting mechanism for setting the alignment of the bonding tool with respect to the bonding head. The adjusting mechanism is thereby preferably formed in such a way that the incline of the base plane of the bonding tool can be set with respect to the bonding head. A setting of the height of the bonding tool with respect to the bonding head is furthermore also conceivable.

It is advantageous when the adjusting mechanism has at least two, preferably three setting screws. The incline of the base plane of the bonding tool can be set by two setting screws and a further fixed point by screwing in or unscrewing, respectively, the setting screws. The height of the bonding tool can additionally also be set with respect to the bonding head by aid of the third setting screw. The setting screws thereby preferably have a ball-like tip, which can engage with a V-shaped setting groove in the bonding head. By the ball-like tip and the corresponding V-shaped setting groove, the setting screws can be rotated well on the one hand, and, on the other hand, sufficient contact is provided between the ball-like tip and the V-shaped setting groove, in order to ensure a stable hold of the bonding tool on the bonding head.

It is advantageous when the bonding tool has electrical contacts for the electrical connection to the bonding head. For example, the receiving head and/or the lighting unit are supplied with electrical energy and are controlled via these electrical contacts. Due to the fact that the electrical connection is established via the electrical contacts, separate wires or cables for the energy supply and the control of the receiving head and/or of the lighting unit are also not necessary, so that the replacement of the bonding tool is easier.

Advantageously, the opening is circular, wherein the centers of the circular disk-shaped base body and of the opening preferably coincide. The opening then remains unchanged, even if the bonding tool is rotated about the axis of rotation of the circular disk-shaped base body on the bonding tool.

It is advantageous when the bonding tool has a spring assembly, which is arranged in the opening, wherein the receiving head is fastened to the spring assembly, so that the receiving head is resiliently connected to the base body. Due to the resilient connection of the receiving head to the base body, vibrations, which can appear, for example, during the displacement of the bonding tool, are transferred to the receiving head in weakened intensity, so that the holding of the component is not or only slightly influenced. Also, when receiving the component, hard contacts of the receiving head with the component are also weakened by the spring assembly, which prevents damages to the receiving head as well as to the component.

It is advantageous when the spring assembly comprises at least four leaf springs, which are arranged in a parallelogram-like manner. Two of the leaf springs are thereby arranged along one side of the opening, and the other two leaf springs are arranged along the other side of the opening. The opening thus remains largely free, and the receiving head can still be accessed freely through the opening, so that, for example, the optical detection of the component to be bonded is still possible perpendicularly from the top by the camera. The respective two leaf springs on the one and on the other side of the opening are additionally arranged parallel to one another, wherein the spacing largely runs in the direction of the axis of rotation of the circular disk-shaped base body. It is achieved thereby that the receiving head maintains its alignment even when springs are loaded.

The bonding tool advantageously has a sensor for measuring the contact force of the component on the substrate. For utilizations, in the case of which the component has to be pressed onto the substrate with a certain contact force during the bonding, the measuring of this contact force is provided thereby.

It is advantageous when the sensor is formed to measure the deflection of the receiving head to the base body. The deflection of the receiving head to the base body can thereby be determined very easily. The contact force can then be calculated via the deflection and the known spring constant of the spring assembly.

It is advantageous when the sensor comprises optical sensors, an ultrasonic assembly and/or strain gauges, because an accurate and quick measurement of the deflection of the receiving head to the base body is possible therewith.

What is furthermore proposed is a bonding device for bonding at least one component by adhesives to a substrate located in an assembly position. The bonding device has a work plate extending along a work plane, and a base frame supporting this work plate, as well as a displaceable bonding head comprising a bonding tool. The bonding tool is thereby formed according to the preceding description, wherein it comprises in particular a receiving head for receiving and holding the components. The bonding device furthermore comprises a displaceable metering valve for applying adhesive to the substrate.

According to the invention, the bonding tool has a lighting unit, which is integrated in the bonding tool, for curing the adhesive. The adhesive cures quickly by an application with a light of suitable wavelengths. Due to the fact that the lighting unit is integrated in the bonding tool, an illumination of the adhesive is possible even at difficult assembly positions. The bonding tool and a bonding head can no longer obstruct the light path from the lighting unit to the adhesive. For a camera system it is also possible to measure the receiving head and the component to be bonded through an opening of the bonding tool. Due to the fact that the lighting unit is integrated in the bonding tool, a replacement of the bonding tool at the bonding head is furthermore possible, without a complex adjustment of the lighting unit to the bonding tool being necessary after the insertion of the new bonding tool.

Advantageously, the bonding tool is rotatably supported on the bonding head. By rotating the bonding tool, whereby the receiving head and the component held on the receiving head rotate as well, the desired orientation of the component with respect to the substrate can thus be obtained.

It is advantageous when the bonding tool has electrical contacts, and the bonding head has electrical counter contacts for the electrical connection. The bonding tool can be controlled and/or supplied with electrical energy via this electrical connection. Additional cable connections are thus not necessary, which, on the one hand, simplifies the replacement of the bonding tool, and which, on the other hand, increases the flexibility of the bonding tool.

It is advantageous when the bonding device comprises a camera system, which is directed to the assembly position, for measuring the alignment of the component to the substrate. Based on the results of this measurement, it is either determined that the component already has the desired alignment to the substrate, or the bonding head and/or the bonding tool are controlled in such a way that the desired alignment of the component to the substrate is attained.

The bonding device advantageously has a distance sensor for determining the distance of the component to the substrate. For applications, in the case of which a predefined distance between the component and the substrate is to be maintained during the bonding, the distance sensor makes it possible to determine this distance. The distance sensor can thereby be, for example, an optical sensor, which is directed to an edge of the component, parallel to the work plane. A higher accuracy is attained when the distance sensor comprises at least two optical sensors, which are directed to at least two edges of the component, because inclines of the component to the substrate can also be recognized and corrected thereby.

What is further proposed is a bonding method for bonding components by adhesives to a substrate. With the bonding method, a component to be bonded is received in a receiving position by a bonding tool, which is arranged on a bonding head of a bonding device. At the same time or following this, an adhesive application to the substrate, to which the component is to be applied, is performed at an assembly position. The bonding head with the bonding tool and the received component is subsequently displaced to the assembly position, the component is placed onto the adhesive structure with a specified height and/or contact force and is held there. Whether the component is thereby pressed onto the substrate with a specified contact force or is held at a specified height, that is, at a predefined distance from the substrate, is thereby dependent on the component and on the respective application case. A lighting unit integrated in the bonding tool is then activated to cure the adhesive. The duration of the application with light is thereby dependent on the used adhesive and on the thickness of the adhesive, among other things. Finally, the component is released from a receiving head of the bonding tool, and the bonding head is moved back. The adhesive cures quickly by an application with a light of suitable wavelengths. Due to the fact that the lighting unit is integrated in the bonding tool, an illumination of the adhesive is possible even at difficult assembly positions. The bonding tool and a bonding head can no longer obstruct the light path from the lighting unit to the adhesive. For a camera system it is furthermore also possible to measure the receiving head and the component to be bonded through an opening of the bonding tool. Due to the fact that the lighting unit is integrated in the bonding tool, a replacement of the bonding tool at the bonding head is furthermore possible, without a complex adjustment of the lighting unit to the bonding tool being necessary after the insertion of the new bonding tool.

It is advantageous when alignment with the substrate takes place via a camera system through an opening of the bonding tool from the top onto the component. An exact alignment of the component with respect to the substrate is essential for many applications. The component can be measured from the top with respect to the substrate via the camera system. If this measurement shows that the component is already aligned exactly with respect to the substrate, the activation of the lighting unit can be continued. Otherwise, the bonding head and/or the bonding tool are controlled in such a way that the desired alignment of the component with respect to the substrate is obtained. The component is then preferably measured by the camera system once more, and a further correction of the alignment of the component is performed, if necessary.

It is advantageous when, prior to the activation of the lighting unit, verification and/or measuring steps are performed for the proper assembly of the component on the substrate. These, verification and/or measuring, steps can comprise the measuring of the alignment of the component with respect to the substrate by the camera system, the measuring of a contact force of the component on the substrate and/or the measuring of a distance of the component from the substrate. Should the desired values not be maintained, another correction can be performed prior to the activation of the lighting unit. Otherwise, the lighting unit is activated, and the adhesive is cured therewith.

For the alignment, the bonding tool is advantageously rotated in the bonding head and/or the bonding head is displaced in the work plane. By rotating the bonding tool in the bonding head, the orientation of the component is changed with respect to the substrate, while the position of the component is changed with respect to the substrate by displacing the bonding head in the work plane. The component can be brought into a predefined position to the substrate by combining the two movements.

Finally, it is advantageous when, after the bonding process, the substrate is displaced out of the assembly position, or a further component is bonded to the substrate. If several components are bonded to a substrate, this can be performed in quick succession, without having to move the substrate. If all of the components to be bonded are bonded to the substrate, the substrate is displaced out of the assembly position, whereby space is created at the assembly position for a further substrate, to which one or several components are to be bonded.

Further developments, advantages, and application possibilities of the invention also follow from the following description of exemplary embodiments and from the figures. All of the described and/or figuratively illustrated features are thereby generally subject matter of the invention, either alone or in any combination, regardless of the combination thereof in the claims or the dependency thereof. The content of the claims is also made a part of the description.

BRIEF DESCRIPTION OF THE DRAWINGS

The invention will be described in more detail below on the basis of exemplary embodiments in connection with the drawings, in which

FIG. 2b shows a longitudinal section through the bonding tool from FIG. 2a.

DETAILED DESCRIPTION OF THE INVENTION

Figure 1:
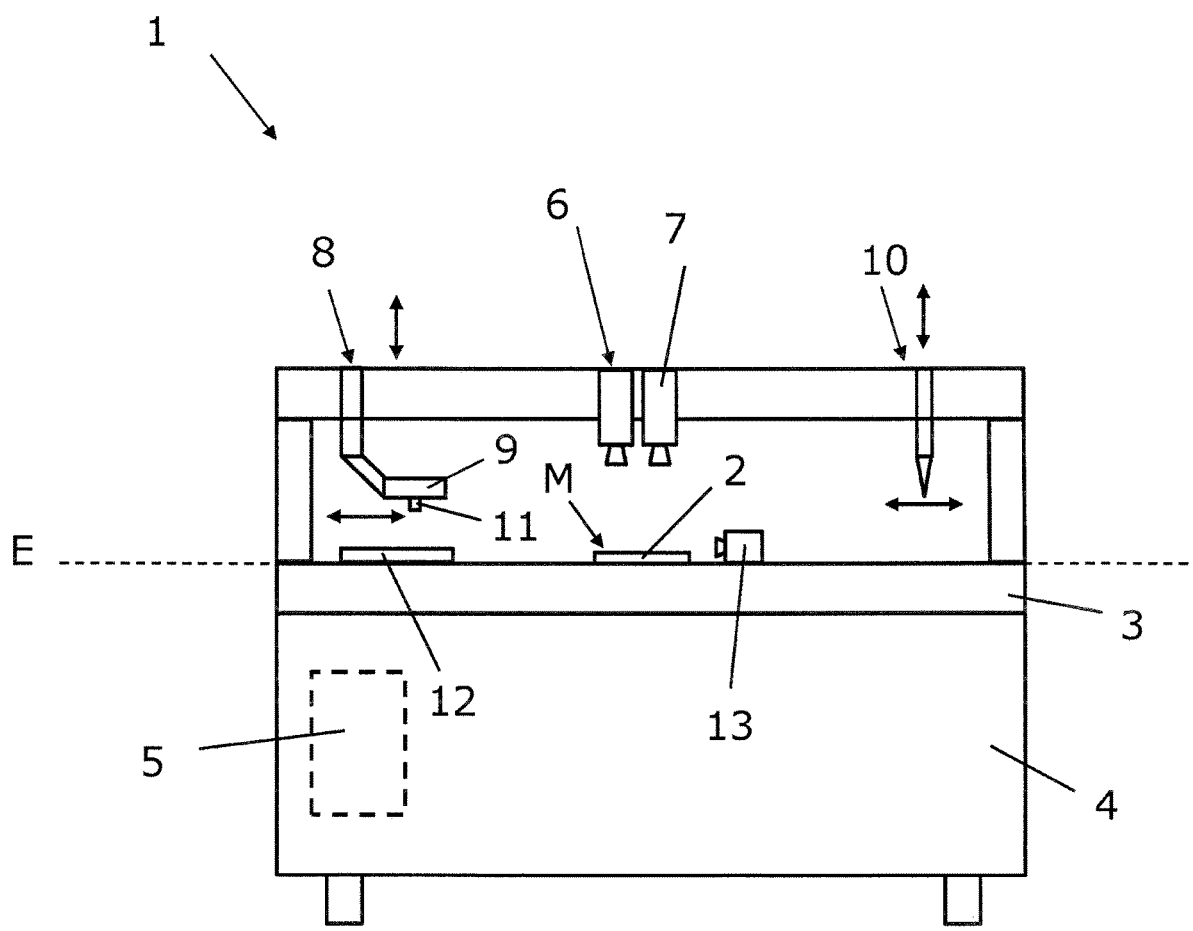
FIG. 1 shows a schematic side view of a bonding device.

Identical reference numerals are used in the figures for elements of the invention, which are identical, or which act identically. For the sake of clarity, only reference numerals, which are required for the description of the respective figure, are illustrated in the individual figures.

FIG. 1 shows a schematic side view of a bonding device 1 for bonding at least one component by adhesives to a substrate 2 located in an assembly position M. The bonding device 1 comprises a work plate 3 and a base frame 4 supporting the work plate 3. The top side of the work plate 3 thereby defines a work plane E.

The substrate 2, to which the component or the components, respectively, are to be bonded, is located in the center of the work plate 3, in the assembly position M. A control unit 5 of the bonding device 1, which controls the units of the bonding device 1, is only indicated.

A camera system 6, here, for example, comprising two cameras 7, is arranged above the assembly position M. A bonding head 8 comprising a bonding tool 9 as well as a metering valve 10 for adhesive are arranged above the work plate 3. The bonding head 8 as well as the metering valve 10 can be displaced in the work plane E and perpendicular to the work plane E.

For bonding a component by adhesives to the substrate 2, the component is initially received by a receiving station 12 by a receiving head 11 of the bonding tool 9. At the same time or following this, adhesive is applied to the substrate 2 at specified locations at the assembly position M by the metering valve 10. The bonding head 8 is then displaced to the assembly position M with the bonding tool 9 and the received component.

Before the component is laid down on the substrate 2, it is detected by the cameras 7 of the camera system 6 through an opening in the bonding tool 9 and is evaluated in the control unit 5 by an image processing software. The measured position of the component with respect to the substrate 2 is compared to the predetermined, i.e., desired, position of the component with respect to the substrate 2. If these positions correspond, the component is laid down on the substrate 2. If, in contrast, the positions do not correspond, the position of the component is corrected. For this purpose, the bonding head 8 is displaced with the bonding tool 9 and the received component in the work plane E and/or the bonding tool 9 is rotated in the bonding head 8. The component is now detected again by the camera system 6 and is evaluated by the image processing software. If the actual position of the component with respect to the substrate 2 now corresponds to the specified position, the component is laid down on the substrate 2, or else the position is corrected once again.

If the position of the component with respect to the substrate 2 is now correct, the component is laid down on the substrate 2 and is held at a predefined distance from the substrate 2. This distance is thereby measured by a distance sensor 13, which is illustrated as optical sensor here and which is arranged close to the assembly position M. The optical sensor is thereby directed to an edge of the component, parallel to the work plane E. Yet a further optical sensor, which is directed to another edge of the component, is preferably provided, so that inclines of the component can also be recognized.

The measured distance is compared to a predetermined distance by the control unit 5, and the bonding head 8 is moved perpendicular to the work plane E until the measured distance corresponds to the specified distance.

As an alternatively to the holding of the component above the substrate 2, the component can also be pressed onto the substrate 2 with a specified contact force. This contact force is measured by a sensor, which is not illustrated in this figure. Also in this case, the bonding head 8 is moved perpendicular to the work plane E until the measured contact force corresponds to the predetermined contact force.

If the distance of the component from the substrate 2 or the contact force of the component on the substrate 2, respectively, now correspond to the predetermined values, the position of the component with respect to the substrate 2 is detected by the camera system 6 once again to be on the safe side and is evaluated in the control unit 5. Possible deviations are corrected, in turn, by displacing the bonding head 8 in the work plane E or by rotating the bonding tool 9 in the bonding head 8.

When all positions, distances and/or contact forces are correct, a lighting unit integrated in the bonding tool 9 is activated for curing the adhesive. This lighting unit is thereby arranged in such a way that it can apply light to the adhesive between the substrate 2 and the component. The duration of the application with light is thereby dependent on the type and thickness of the adhesive and on the intensity of the light, among other things.

After the illumination of the adhesive has ended, the component, which is bonded to the substrate 2, is released from the receiving head 11 of the bonding tool 9, and the bonding head 8 is moved back, preferably to the receiving station 12. The receiving head 11 can now receive a further component and can bond it to the substrate 2 as described above. These steps are repeated so often, until all of the components to be bonded to the substrate 2 have been bonded to the substrate 2. The substrate 2 is subsequently displaced out of the assembly position M, and a further substrate 2 is preferably moved into the assembly position M.

Figure 2A:
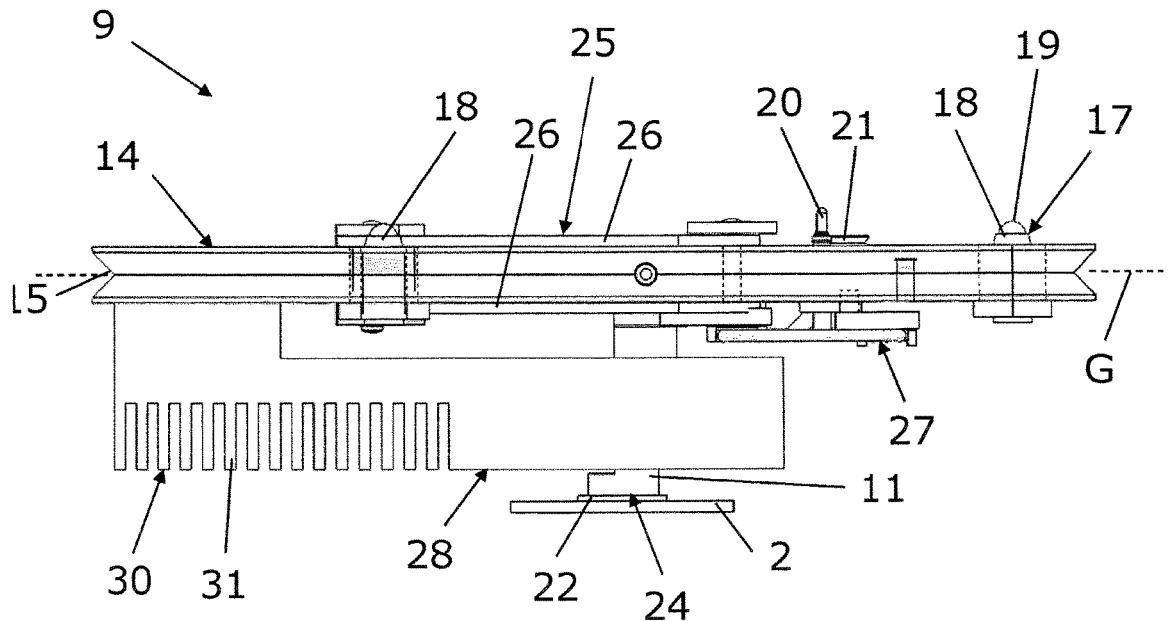
FIG. 2a shows a side view of a bonding tool.
Figure 2B:
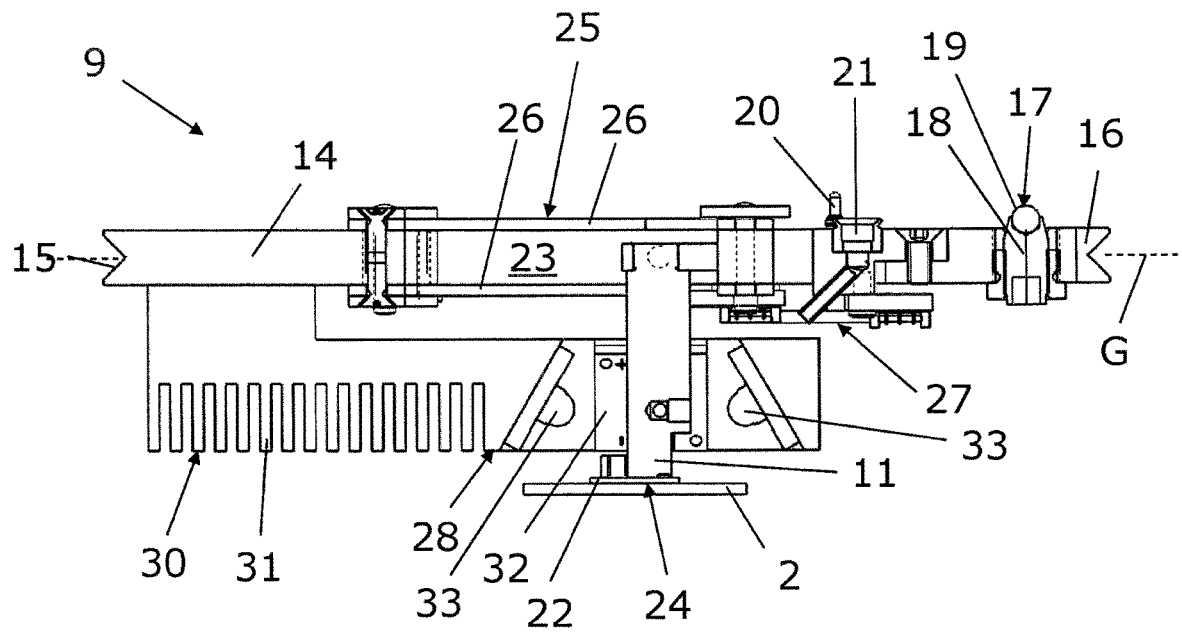
Figure 2C:
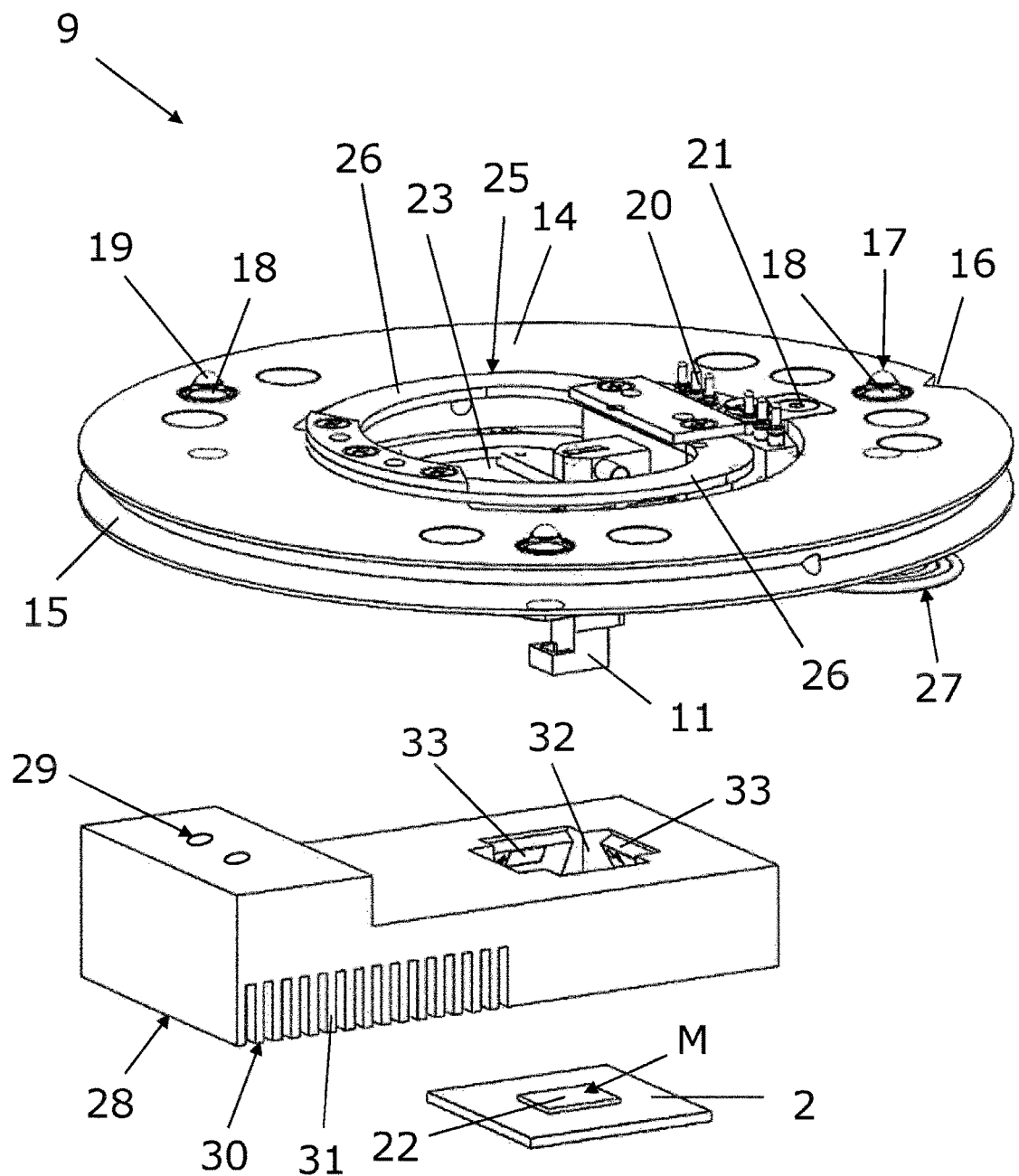
FIG. 2c shows a perspective view of the bonding tool from FIGS. 2a and 2b.
Figure 2D:
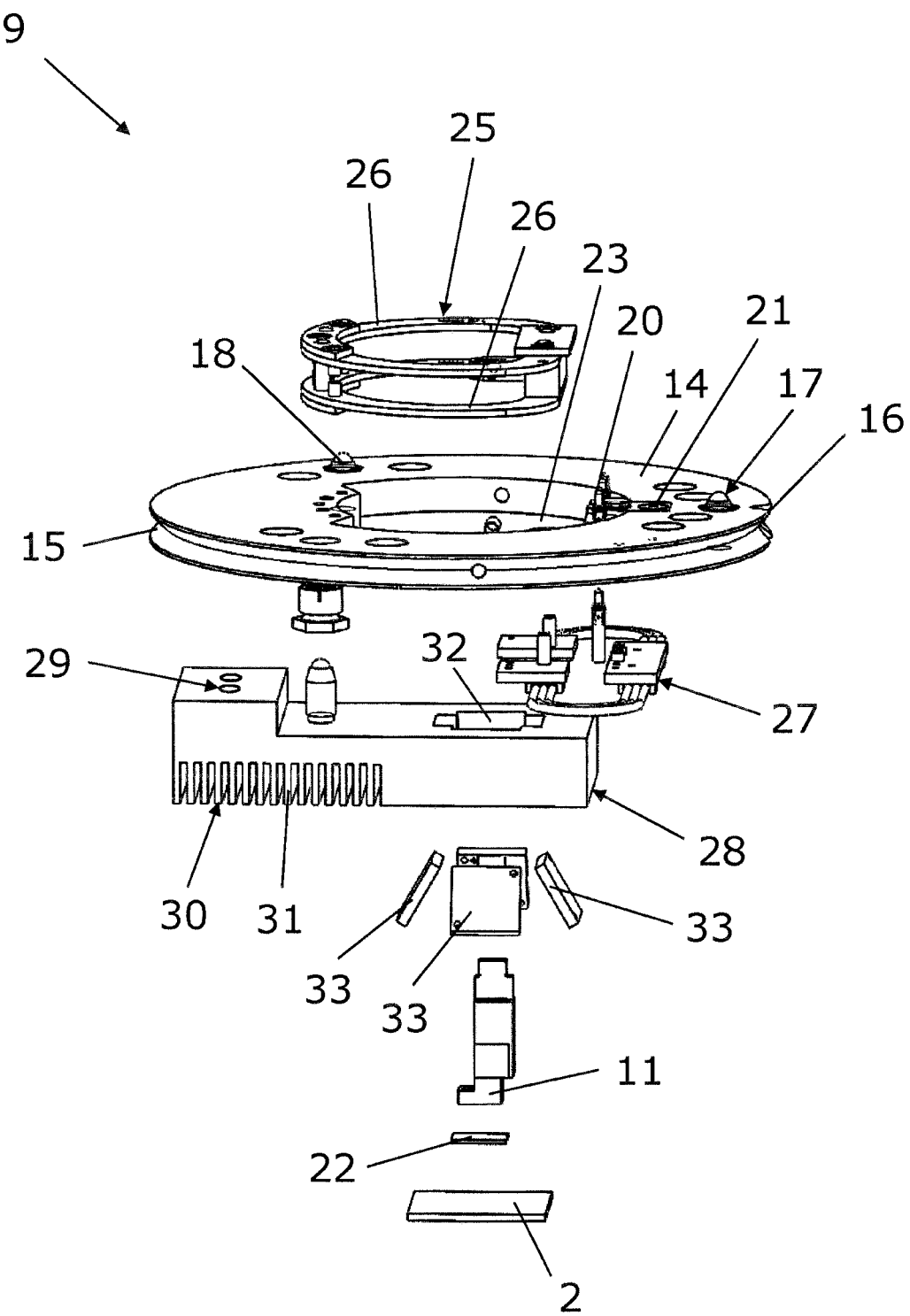
FIG. 2d shows a perspective exploded drawing of the bonding tool from FIGS. 2a to 2c.

The bonding tool 9 according to the invention will be described in more detail on the basis of FIGS. 2a to 2d. FIG. 2a thereby shows the bonding tool 9 in a side view, FIG. 2b in a longitudinal section, FIG. 2c in a perspective view, and FIG. 2d in a perspective exploded drawing.

The bonding tool 9 has a circular disk-shaped base body 14, which lies in a base plane G. Arranged on the circumference of the circular disk-shaped base body 14 is a V-shaped groove 15, with which double frustoconical holding elements of the bonding head 8 engage. The bonding tool 9 is thus fastened to the bonding head 8 via the double frustoconical holding elements of the bonding head 8. The double frustoconical holding elements are further rotatable, so that a rotation of the bonding tool 9 with respect to the bonding head 8 is affected by a rotation of the double frustoconical holding elements. The orientation of the component with respect to the substrate 2 can be changed by such a rotation, so that the predetermined orientation is attained.

Alternatively, or in addition to the fastening of the bonding tool 9 to the bonding head 8 by the V-shaped groove 15, the bonding tool 9 can also be fastened to the bonding head 8 via magnetic force. For this purpose, the bonding tool 9 has at least one magnet, and the bonding head 8 has a corresponding ferromagnetic region and/or the bonding tool 9 has a ferromagnetic region, and the bonding tool 8 has a corresponding magnet.

A location of the circumference of the circular disk-shaped base body 14 furthermore has a V-shaped notch 16, which runs perpendicular to the V-shaped groove 15 and perpendicular to the base plane G. An engagement element of the bonding head 8 engages with this V-shaped notch 16, so that the alignment of the bonding tool 9 with respect to the bonding head 8 can be recognized by the bonding head 8.

The incline of the bonding tool 9 to the bonding head 8 can be set via an adjusting mechanism 17 comprising three setting screws 18. The setting screws 18 thereby comprise ball-like tips 19, which in each case engage with a V-shaped setting groove in the bonding head 8. By unscrewing or screwing in, respectively, the setting screws 18, the incline of the bonding tool 9 to the bonding head 8 is changed. The distance of the bonding tool 9 from the bonding head 8 can furthermore also be set to a small extent. The incline of the bonding tool 9 is thereby preferably set so that the base plane G comes to rest parallel to the work plane E.

The bonding tool 9 furthermore comprises electrical contacts 20, which are arranged on a top side of the bonding tool 9. These electrical contacts 20 come into contact with electrical counter contacts of the bonding head 8, and thus establish an electrical connection between the bonding tool 9 and the bonding head 8. The bonding tool 9 is controlled and supplied with electrical energy via this electrical connection. Separate cables are thus not necessary for this. The bonding tool 9 furthermore has a negative pressure connection 21, via which the receiving head 11 is supplied with negative pressure, so that components 22 can be received therewith.

The circular disk-shaped base body 14 of the bonding tool 9 furthermore comprises an opening 23, wherein the opening 23 is arranged essentially in a circular manner and concentrically with the circular disk-shaped base body 14. The receiving head 11 of the bonding tool 9 is thereby arranged so that an orthogonal projection of the receiving head 11 onto the base plane G lies within the opening 23. This means that perpendicular to the base plane G, thus viewed from the top or from the bottom, the receiving head 11 lies within the opening 23. The receiving head 11 can thus be accessed freely through the opening 23, for example for measurements by the camera system 6.

On its lower end, the receiving head 11 comprises a vacuum unit 24, which, when it is supplied with negative pressure via the negative pressure connection 21, can receive and hold a component 22. In the alternative, the receiving head 11 can comprise a gripping unit, by which components 22 can be gripped. In the case of such a receiving head 11, the negative pressure connection 21 can also be omitted. Due to the fact that the bonding tool 9 is arranged in a replaceable manner on the bonding head 8, it is also conceivable to use a bonding tool 9 comprising a receiving head 11 comprising a vacuum unit 24 for some applications, and a bonding tool 9 comprising a receiving head 11 comprising a gripping unit for other applications.

The receiving head 11 is resiliently connected to the base body 14 via a spring assembly 25. This resilient connection serves the purpose of weakening impacts and vibrations, which can appear, for example, when displacing the bonding head 8. Moreover, the resilient connection can be used to measure the contact force of the component 22 on the substrate 2.

The spring assembly 25 thereby comprises four leaf springs 26, which are arranged in a parallelogram-like manner Two of the leaf springs 26 thereby extend approximately in a semi-circular manner along the one inner side of the opening 23, while the other two leaf springs 26 extend approximately in a semi-circular manner along the other inner side of the opening 23. The respective two leaf springs 26 are thereby spaced apart from one another in a direction perpendicular to the base plane G. The one end of the leaf springs is thereby firmly connected to the base body 14, and the other end is firmly connected to the receiving head 11. Due to the parallelogram-like arrangement of the leaf springs 26, the orientation of the receiving head 11 to the base body 14 does not change when a force is exerted on the receiving head 11 and thus on the spring assembly 25. Due to the fact that the leaf springs 26 are arranged along the inner side of the opening 23, the accessibility of the receiving head 11 through the opening 23 is moreover only slightly limited.

Due to the fact that the receiving head 11 is arranged in a movable manner with respect to the base body 14, the electrical connection and/or the negative pressure connection of the receiving head 11 to the base body 14 takes place via a flexible connecting element 27.

The bonding tool 9 furthermore has a replaceable lighting unit 28, which is integrated in the bonding tool 9. The adhesive, which was applied to the substrate 2, is cured by this lighting unit 28. The energy supply of the lighting unit 28 thereby takes place via an electrical interface 29, which is connected to the circuit of the base body 14, and thus to the circuit of the bonding head 8.

The lighting unit 28 is thereby a UV LED unit, because LEDs are particularly efficient and have a comparatively low heat development. To discharge the heat, which arises nonetheless, corresponding heat conducting ducts, which are not illustrated here, and a cooling unit 30 are provided. The cooling unit 30 thereby comprises a plurality of cooling fins 31, so that the heat can be discharged quickly to the ambient air via the large surface of the cooling fins 31.

A recess 32 is provided around the receiving head 11 in the lighting unit 28, so that the receiving head 11 can still be accessed freely through the opening 23 and the recess 32, in particular for the camera system 6.

Four UV LEDs 33 are arranged adjacent to the recess 32, wherein the LEDs 33 are arranged evenly around the receiving head 11. These LEDs 33 are moreover aligned obliquely downward in such a way that they optimally illuminate the assembly position M, at which the component 22 to be bonded is located. Due to the fact that the illumination takes place from four sides, the assembly position M is also illuminated largely evenly, so that the adhesive cures evenly.

Due to the fact that the lighting unit 28 is integrated in the bonding tool 9, a complex adjustment of the lighting unit 28 to the bonding tool 9 or to the assembly position M, respectively, is omitted. The free accessibility of the receiving head 11 can furthermore be maintained, without the lighting unit 28 and the camera system 6 being in each other's light path.

Due to the replaceability of the lighting unit 28, it is additionally possible to exchange a defective lighting unit 28 for a functional lighting unit 28 in an uncomplicated manner. Different lighting units 28 can furthermore be used at the same bonding tool 9, for example with a different arrangement of the LEDs 33 or with LEDs 33, which radiate light with different spectra, in each case adapted to the component 22 to be bonded or the used adhesive, respectively.

A sensor unit, which is not shown here, can furthermore be provided for measuring the contact force of the component 22 on the substrate 2. This sensor unit is required when the component 22 is to be pressed onto the substrate 2 with a predefined contact force during the bonding. The sensor unit thereby preferably utilizes the deflection, which is caused by the contact pressure, of the receiving head 11, which is connected to the base body 14 via the spring assembly 25. This is so, because the contact force can be calculated easily via the deflection and the known spring constant of the spring assembly 25. The deflection can thereby be determined, for example, by optical sensors, by an ultrasonic assembly and/or by strain gauges.

LIST OF REFERENCE NUMERALS 1 bonding device
2 substrate
3 work plate
4 base frame
5 control unit
6 camera system
7 camera
8 bonding head
9 bonding tool
10 metering valve
11 receiving head
12 receiving station
13 distance sensor
14 base body
15 V-shaped groove
16 notch
17 adjusting mechanism
18 setting screw
19 ball-like tip
20 electrical contact
21 negative pressure connection
22 component
23 opening
24 vacuum unit
25 spring assembly
26 leaf spring
27 connecting element
28 lighting unit
29 electrical interface
30 cooling unit
31 cooling fins
32 recess
33 LED
E work plane
G base plane
M assembly position

The invention claimed is:

1. A bonding tool for a bonding device for bonding at least one component by adhesives to a substrate, the bonding tool comprising:
a circular disk-shaped base body lying in a base plane and having an opening and a receiving head connected to the circular disk-shaped base body for receiving and holding the at least one component, wherein an orthogonal projection of the receiving head onto the base plane lies within the opening, so that the receiving head can be accessed freely through the opening, wherein the bonding tool comprises a lighting unit, which is integrated in the bonding tool, for curing the adhesives.

2. The bonding tool according to claim 1, wherein the lighting unit is replaceable.

3. The bonding tool according to claim 1, wherein the lighting unit is a UV lighting unit or a UV LED unit.

4. The bonding tool according to claim 3, wherein the UV LED unit comprises at least two LEDs.

5. The bonding tool according to claim 1, wherein the lighting unit comprises a cooling unit, or cooling fins.

6. The bonding tool according to claim 1, wherein the lighting unit is electrically connected to the base body via an electrical interface.

7. The bonding tool according to claim 1, wherein the receiving head comprises a gripping unit and/or a vacuum unit.

8. The bonding tool according to claim 1, wherein the bonding tool comprises fastening elements for fastening to a bonding head of a bonding device.

9. The bonding tool according to claim 8, wherein the fastening elements comprise a V-shaped groove, which is arranged on a circumference of the base body.

10. The bonding tool according to claim 1, wherein the bonding tool comprises at least one magnet and/or a ferromagnetic region for magnetically fastening the bonding tool to a bonding head of the bonding device.

11. The bonding tool according to claim 10, wherein the bonding tool comprises an adjusting device for setting an alignment of the bonding tool with respect to the bonding head.

12. The bonding tool according to claim 11, wherein the adjusting device comprises at least two setting screws, wherein the setting screws have a ball-like tip for engaging with a V-shaped setting groove in the bonding head.

13. The bonding tool according to claim 1, wherein the bonding tool has electrical contacts for an electrical connection to the bonding head.

14. The bonding tool according to claim 1, wherein the opening is circular.

15. The bonding tool according to claim 1, wherein the bonding tool comprises a spring assembly, which is arranged in the opening, wherein the receiving head is fastened to the spring assembly, so that the receiving head is resiliently connected to the circular disk-shaped base body.

16. The bonding tool according to claim 15, wherein the spring assembly comprises at least four leaf springs which are arranged in a parallelogram-like manner.

17. The bonding tool according to claim 1, wherein the bonding tool comprises a sensor device for measuring a contact force of the at least one component on the substrate.

18. The bonding tool according to claim 17, wherein the sensor device measures a deflection of the receiving head to the circular disk-shaped base body.

19. The bonding tool according to claim 17, wherein the sensor device comprises optical sensors, an ultrasonic assembly and/or strain gauges.

20. The bonding tool according to claim 1, further comprising a displaceable metering valve for applying the adhesives to the substrate.

21. The bonding tool according to claim 13, wherein the bonding tool is rotatably supported on the bonding head.

22. The bonding tool according to claim 10, wherein the bonding head comprises electrical counter contacts for an electrical connection.

23. The bonding tool according to claim 11, wherein the adjusting device is a camera system, which is directed to an assembly position, for measuring the alignment of the component in relation to the substrate.

\* \* \* \* \*